(12) United States Patent
Park et al.

(10) Patent No.: US 12,689,374 B2
(45) Date of Patent: Jul. 21, 2026

(54) IMPEDANCE ADJUSTMENT CIRCUIT AND SEMICONDUCTOR APPARATUS INCLUDING THE IMPEDANCE ADJUSTMENT CIRCUIT

(71) Applicant: SK hynix Inc., Icheon-si (KR)

(72) Inventors: Ji Hwan Park, Icheon-si (KR); Se Ra Jeong, Icheon-si (KR); Jae Hoon Cha, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 45 days.

(21) Appl. No.: 18/982,486

(22) Filed: Dec. 16, 2024

(65) Prior Publication Data

US 2026/0012176 A1     Jan. 8, 2026

(30) Foreign Application Priority Data

Jul. 4, 2024     (KR) ........................ 10-2024-0088262

(51) Int. Cl.
| | |
|---|---|
| *H03K 19/00* | (2006.01) |
| *G11C 7/10* | (2006.01) |
| *H03K 5/1534* | (2006.01) |

(52) U.S. Cl.
CPC ....... *H03K 19/0005* (2013.01); *G11C 7/1051* (2013.01); *G11C 7/1078* (2013.01); *H03K 5/1534* (2013.01); *G11C 2207/105* (2013.01); *G11C 2207/2254* (2013.01)

(58) Field of Classification Search
None
See application file for complete search history.

(56) References Cited

U.S. PATENT DOCUMENTS

| | | | |
|---|---|---|---|
| 6,380,758 B1 * | 4/2002 | Hsu .................. | H03K 19/00384 326/87 |
| 7,227,376 B2 * | 6/2007 | Ahmad .............. | H03K 19/0005 326/87 |
| 2019/0131972 A1 * | 5/2019 | Gans .............. | H03K 19/018585 |
| 2019/0295609 A1 | 9/2019 | Arai et al. | |
| 2024/0264779 A1 * | 8/2024 | Cho ........................ | G06F 3/068 |

* cited by examiner

*Primary Examiner* — Anh Q Tran
(74) *Attorney, Agent, or Firm* — WILLIAM PARK AND ASSOCIATES LTD.

(57) ABSTRACT

An impedance adjustment circuit includes a calibration circuit and a code update circuit. The calibration circuit performs an impedance adjustment operation to generate a source impedance code in response to activation of an impedance adjustment enable signal. The code update circuit performs a first channel code update operation to update a first channel impedance code according to the source impedance code when a first channel code update request signal is input, performs a second channel code update operation to update a second channel impedance code according to the first channel impedance code when a second channel code update request signal is input, and blocks the second channel code update operation when the second channel code update request signal is input while performing the first channel code update operation.

19 Claims, 10 Drawing Sheets

FIG. 5

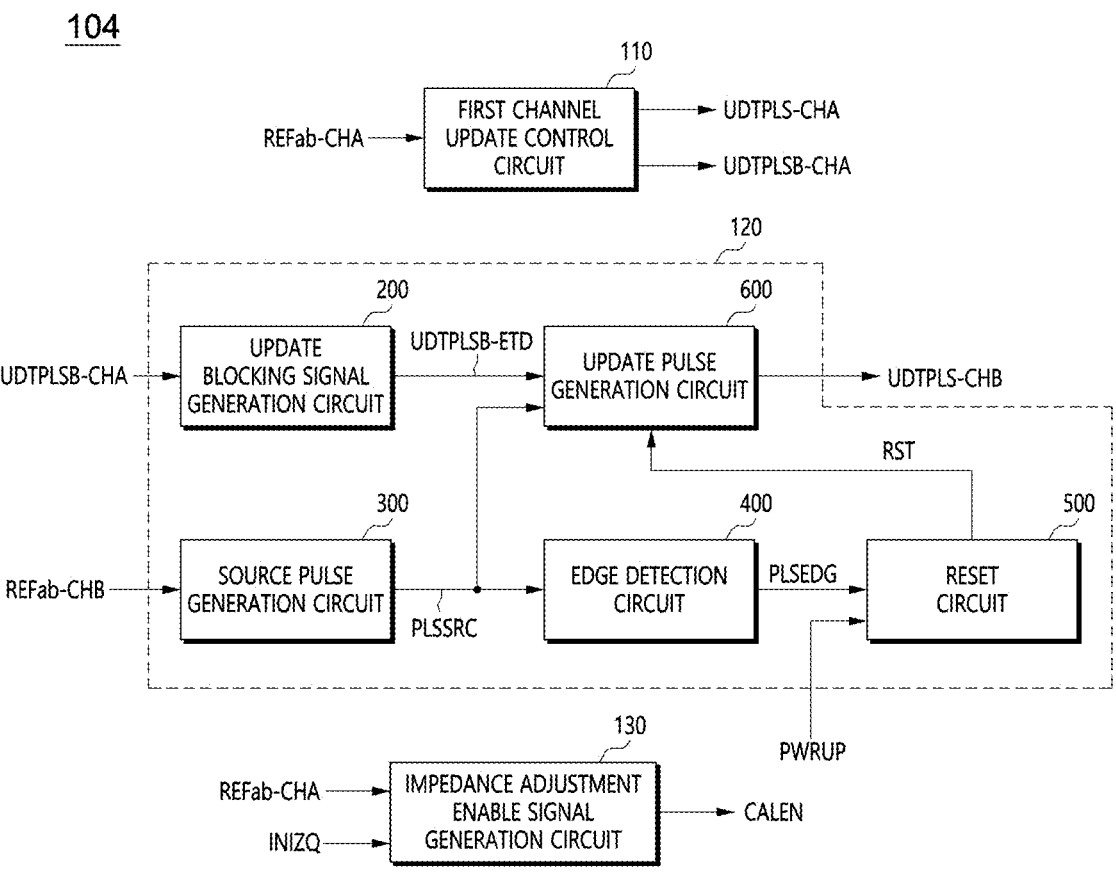

104

110

FIRST CHANNEL
UPDATE CONTROL
CIRCUIT

REFab-CHA ⟶

⟶ UDTPLS-CHA

⟶ UDTPLSB-CHA

120

200

UPDATE
BLOCKING SIGNAL
GENERATION CIRCUIT

UDTPLSB-CHA ⟶

UDTPLSB-ETD

600

UPDATE PULSE
GENERATION CIRCUIT

⟶ UDTPLS-CHB

RST

300

SOURCE PULSE
GENERATION CIRCUIT

REFab-CHB ⟶

PLSSRC

400

EDGE DETECTION
CIRCUIT

PLSEDG

500

RESET
CIRCUIT

130

IMPEDANCE ADJUSTMENT
ENABLE SIGNAL
GENERATION CIRCUIT

REFab-CHA ⟶

INIZQ ⟶

⟶ CALEN

PWRUP

FIG. 6

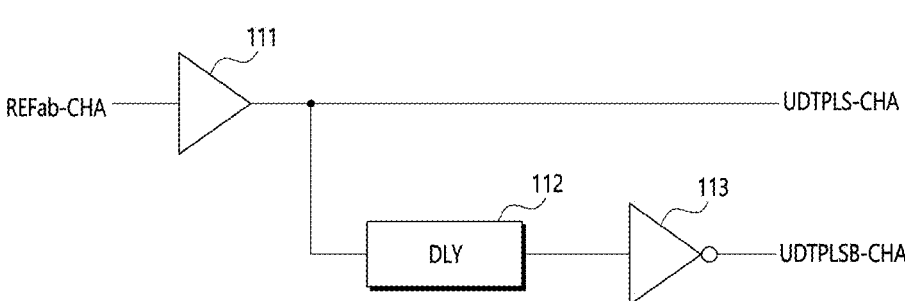

110

111

REFab-CHA ⟶

⟶ UDTPLS-CHA

112

DLY

113

⟶ UDTPLSB-CHA

IMPEDANCE ADJUSTMENT CIRCUIT AND SEMICONDUCTOR APPARATUS INCLUDING THE IMPEDANCE ADJUSTMENT CIRCUIT

CROSS-REFERENCES TO RELATED APPLICATION

The present application claims priority under 35 U.S.C. § 119(a) to Korean application number 10-2024-0088262 filed on Jul. 4, 2024, in the Korean Intellectual Property Office, which application is incorporated herein by reference in its entirety.

BACKGROUND

1. Technical Field

Various embodiments generally relate to a semiconductor circuit, and, more particularly, to an impedance adjustment circuit and a semiconductor apparatus including the impedance adjustment circuit

2. Related Art

As the operating speed of semiconductor apparatuses increases, the swing width of the transmitted and received signals decreases, and signal distortion due to impedance mismatch becomes more problematic. To solve this signal distortion problem, an impedance adjustment circuit is used to adjust termination impedance of a semiconductor apparatus using an external resistor to make it constant regardless of process, voltage, and temperature (PVT) variations.

In a semiconductor apparatus including a plurality of channels, a single external resistor is shared by the plurality of channels to update an impedance code by performing an impedance adjustment operation, but the impedance adjustment operation cannot be performed for each of the plurality of channels due to insufficient timing margin, etc.

Therefore, an impedance code generated by performing an impedance adjustment operation on one channel (hereinafter referred to as a first channel) of the plurality of channels is updated as an impedance code of the first channel, and the impedance code of the first channel is updated as an impedance code of another channel (hereinafter referred to as a second channel) without performing an impedance adjustment operation on the second channel.

Because the plurality of channels operate independently, a mismatch in the timing of updating an impedance code may cause the impedance code to not be updated or to be updated to an incorrect value, so it is necessary to develop a reliable impedance code update technology.

SUMMARY

In an embodiment, an impedance adjustment circuit may include a calibration circuit and a code update circuit. The calibration circuit may be configured to perform an impedance adjustment operation to generate a source impedance code in response to activation of an impedance adjustment enable signal. The code update circuit may be configured to perform a first channel code update operation to update a first channel impedance code according to the source impedance code when a first channel code update request signal is input, may be configured to perform a second channel code update operation to update a second channel impedance code according to the first channel impedance code when a second channel code update request signal is input, and may be configured to block the second channel code update operation when the second channel code update request signal is input while performing the first channel code update operation.

In an embodiment, a semiconductor apparatus may include an impedance adjustment circuit, a first channel, and a second channel. The impedance adjustment circuit may be configured to perform an impedance adjustment operation to generate a source impedance code in response to activation of an impedance adjustment enable signal, may be configured to perform a first channel code update operation to update a first channel impedance code according to the source impedance code when a first channel code update request signal is input, may be configured to perform a second channel code update operation to update a second channel impedance code according to the first channel impedance code when a second channel code update request signal is input, and may be configured to block the second channel code update operation when the second channel code update request signal is input while performing the first channel code update operation. The first channel may include a first memory region and a first transmitter circuit, may provide the first channel code update request signal to the impedance adjustment circuit, and may be configured to adjust an impedance of the first transmitter circuit according to the first channel impedance code. The second channel may include a second memory region and a second transmitter circuit, may provide the second channel code update request signal to the impedance adjustment circuit, and may be configured to adjust an impedance of the second transmitter circuit according to the second channel impedance code.

BRIEF DESCRIPTION OF THE DRAWINGS

FIG. 5 is a diagram illustrating an update control circuit of FIG. 4.

FIG. 6 is a diagram illustrating a first channel update control circuit of FIG. 5.

FIG. 7 is a diagram illustrating an update blocking signal generation circuit of FIG. 5.

FIG. 11 is a diagram illustrating an update pulse generation circuit of FIG. 5.

DETAILED DESCRIPTION

Various embodiments of the present disclosure can improve the operational reliability of a semiconductor apparatus by preventing incomplete code updates and code update failures due to the operating environment.

Hereinafter, embodiments of the present disclosure will be described in more detail with reference to the accompanying drawings.

Figure 1:
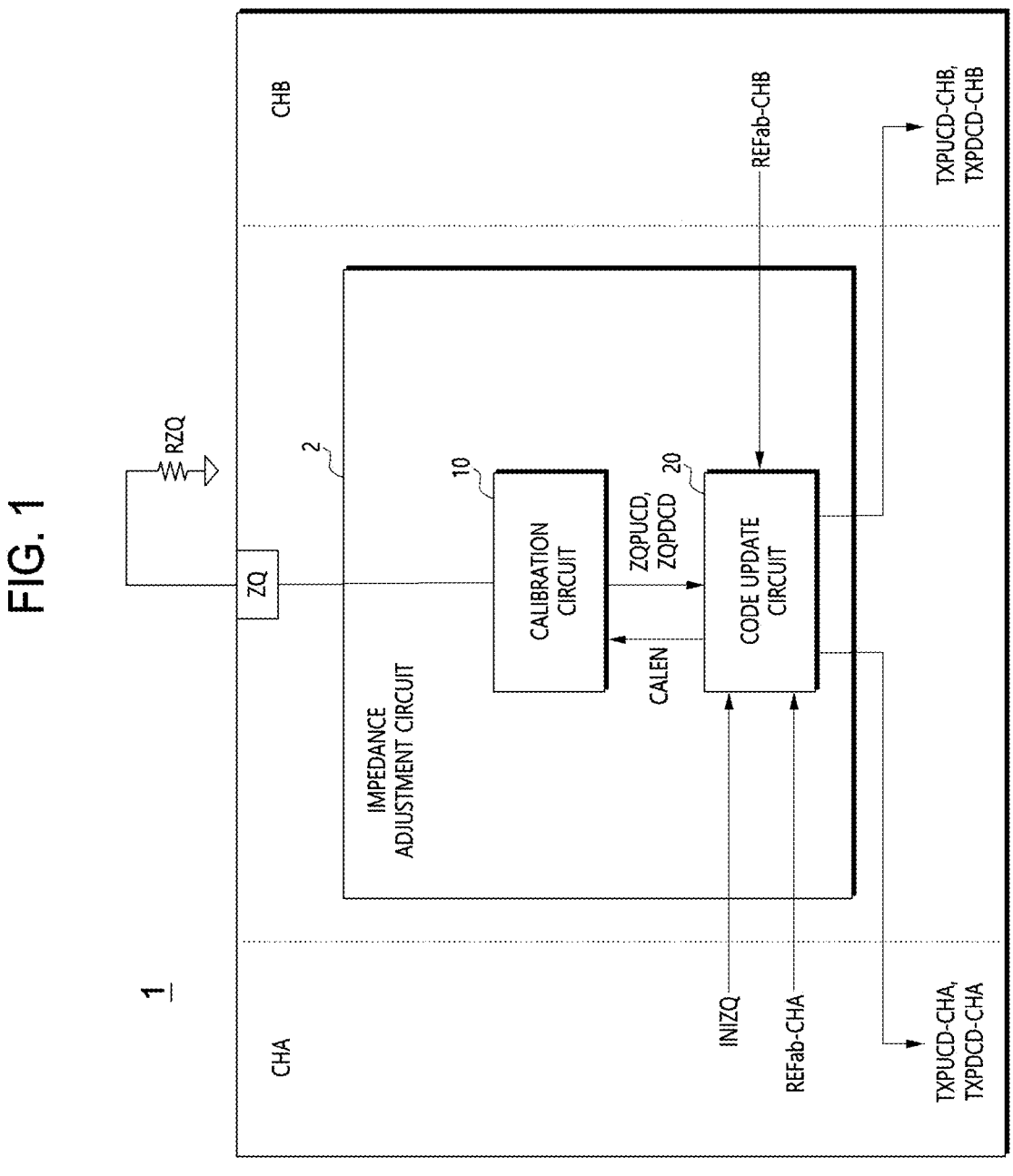
FIG. 1 is a diagram illustrating a semiconductor apparatus according to an embodiment of the present disclosure.

Referring to FIG. 1, a semiconductor apparatus 1 may include a first channel CHA, a second channel CHB, and an impedance adjustment circuit 2.

The first channel CHA and the second channel CHB may each be configured with a memory apparatus. The first channel CHA and the second channel CHB may be configured substantially the same. The first channel CHA and the second channel CHB may operate under independent commands and may have independent data input and output through separate data input/output pads. The first channel CHA may provide an initial impedance adjustment signal INIZQ and a first channel code update request signal REFab-CHA to the impedance adjustment circuit 2. The second channel CHB may provide a second channel code update request signal REFab-CHB to the impedance adjustment circuit 2. While FIG. 1 illustrates an example in which the first channel CHA generates the initial impedance adjustment signal INIZQ, it is possible that the initial impedance adjustment signal INIZQ is generated by the second channel CHB or that it is generated by each of the first channel CHA and the second channel CHB.

The impedance adjustment circuit 2 may be coupled to a reference resistor RZQ that is external to the semiconductor apparatus 1 through an external resistor pad ZQ. The impedance adjustment circuit 2 may be shared by the first channel CHA and the second channel CHB.

The impedance adjustment circuit 2 may receive the initial impedance adjustment signal INIZQ, the first channel code update request signal REFab-CHA, and the second channel code update request signal REFab-CHB as inputs and may output a first channel impedance code TXPUCD-CHA, TXPDCD-CHA and a second channel impedance code TXPUCD-CHB, TXPDCD-CHB.

The impedance adjustment circuit 2 may perform an impedance adjustment operation according to the initial impedance adjustment signal INIZQ to adjust a value of a source impedance code ZQPUCD, ZQPDCD. The impedance adjustment circuit 2 may update the first channel impedance code TXPUCD-CHA, TXPDCD-CHA with the source impedance code ZQPUCD, ZQPDCD within a predetermined delay time. The word "predetermined" as used herein with respect to a parameter, such as a predetermined timing, time, or voltage level, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The impedance adjustment circuit 2 may perform a first channel code update operation and a second channel code update operation. The first channel code update operation may include updating a value of the first channel impedance code TXPUCD-CHA, TXPDCD-CHA provided to the first channel CHA according to the first channel code update request signal REFab-CHA. The second channel code update operation may include updating a value of the second channel impedance code TXPUCD-CHB, TXPDCD-CHB provided to the second channel CHB according to the second channel code update request signal REFab-CHB.

While an impedance adjustment operation based on the input of the first channel code update request signal REFab-CHA is being performed, the impedance adjustment circuit 2 may block the second channel code update operation even if the second channel code update request signal REFab-CHB is input. The impedance adjustment circuit 2 may perform a second channel code additional update operation when the second channel code update request signal REFab-CHB is input. The second channel code additional update operation may include a second channel code update operation that is performed after the first channel code update operation in response to the input of the first channel code update request signal REFab-CHA being terminated.

The impedance adjustment circuit 2 may include a calibration circuit 10 and a code update circuit 20.

The calibration circuit 10 may receive an impedance adjustment enable signal CALEN as an input and may output the source impedance code ZQPUCD, ZQPDCD. The calibration circuit 10 may be coupled to the reference resistor RZQ that is external to the semiconductor apparatus 1 through the external resistor pad ZQ.

The calibration circuit 10 may generate the source impedance code ZQPUCD, ZQPDCD by performing an impedance adjustment operation during an activation period of the impedance adjustment enable signal CALEN.

The code update circuit 20 may receive the initial impedance adjustment signal INIZQ, the first channel code update request signal REFab-CHA, the second channel code update request signal REFab-CHB, and the source impedance code ZQPUCD, ZQPDCD as inputs and may output the impedance adjustment enable signal CALEN, the first channel impedance code TXPUCD-CHA, TXPDCD-CHA, and the second channel impedance code TXPUCD-CHB, TXPDCD-CHB.

The code update circuit 20 may generate the impedance adjustment enable signal CALEN in response to the initial impedance adjustment signal INIZQ and the first channel code update request signal REFab-CHA. The code update circuit 20 may activate the impedance adjustment enable signal CALEN for a predetermined time when the initial impedance adjustment signal INIZQ is input. The code update circuit 20 may activate the impedance adjustment enable signal CALEN after a predetermined delay time when the first channel code update request signal REFab-CHA is input.

The code update circuit 20 may perform the first channel code update operation in response to the first channel code update request signal REFab-CHA. The code update circuit 20 may perform the second channel code update operation according to the second channel code update request signal REFab-CHB while the calibration circuit 10 is not performing an impedance adjustment operation. The code update circuit 20 may perform the first channel code update operation when the first channel code update request signal REFab-CHA is input.

While the first channel code update operation is being performed, the code update circuit 20 may block the second channel code update operation even if the second channel code update request signal REFab-CHB is input.

The code update circuit 20 may perform the second channel code additional update operation when the second channel code update request signal REFab-CHB is input. The second channel code additional update operation may include a second channel code update operation that is performed after the first channel code update operation in response to the input of the first channel code update request signal REFab-CHA being terminated.

The source impedance code ZQPUCD, ZQPDCD may be divided into a source impedance pull-up code ZQPUCD and a source impedance pull-down code ZQPDCD. The first channel impedance code TXPUCD-CHA, TXPDCD-CHA may be divided into a first channel impedance pull-up code TXPUCD-CHA and a first channel impedance pull-down code TXPDCD-CHA. The second channel impedance code TXPUCD-CHB, TXPDCD-CHB may be divided into a second channel impedance pull-up code TXPUCD-CHB and a second channel impedance pull-down code TXPDCD-CHB.

Figure 2:
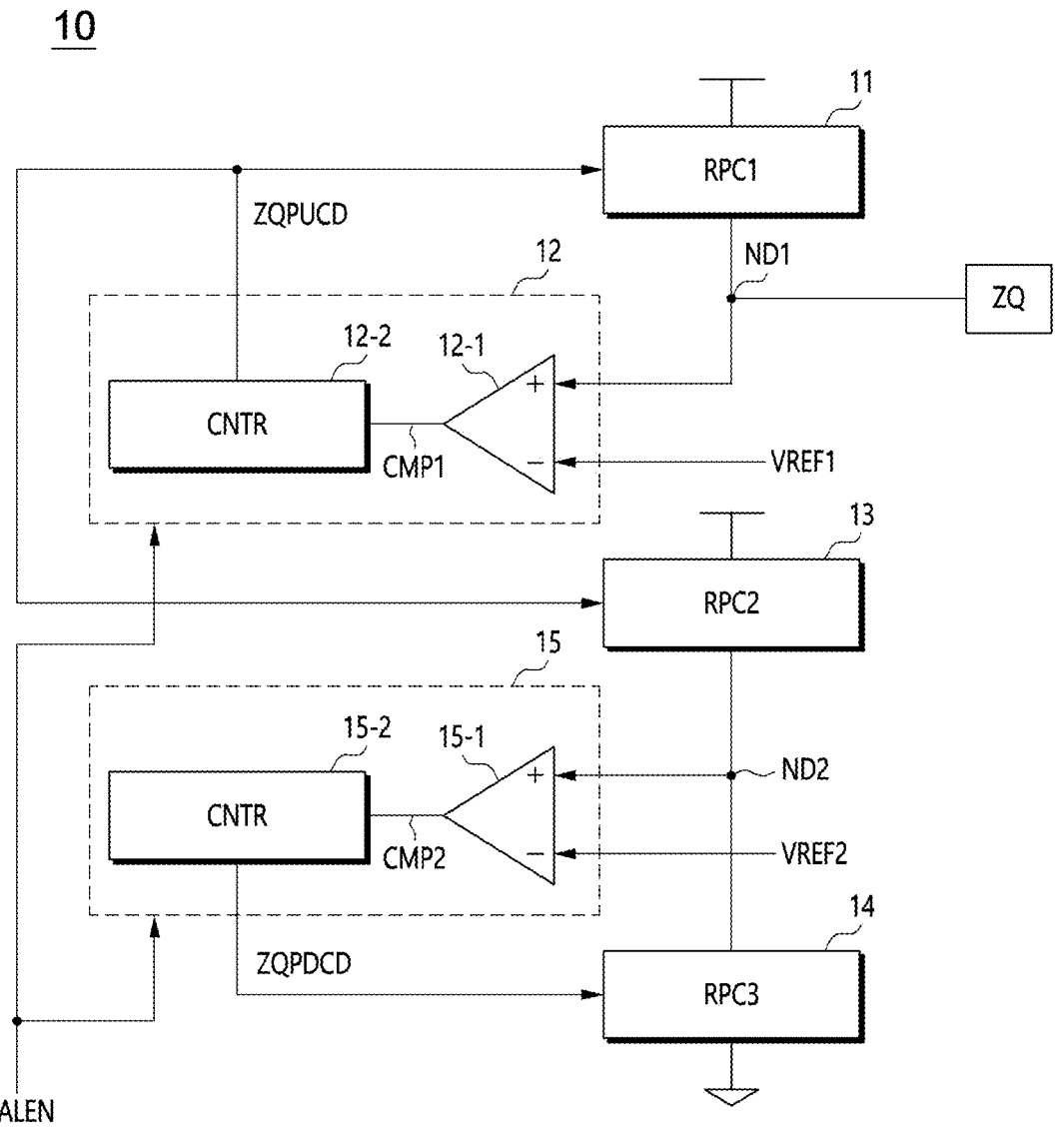
FIG. 2 is a diagram illustrating a calibration circuit of FIG. 1.

FIG. 2 is a diagram illustrating the calibration circuit 10 of FIG. 1.

Referring to FIG. 2, the calibration circuit 10 may include a first replication circuit 11, a first code adjustment circuit 12, a second replication circuit 13, a third replication circuit 14, and a second code adjustment circuit 15.

The first replication circuit 11 may be coupled between a power terminal and a first node ND1. The reference resistor RZQ may be coupled to the first node ND1 through the external resistor pad ZQ. The impedance of the first replication circuit 11 may be adjusted according to the source impedance pull-up code ZQPUCD. The first replication circuit 11 may be constructed by replicating a pull-up driver PUDRV of a transmitter circuit TX-CHA, which will be described later with reference to FIG. 5.

During an activation period of the impedance adjustment enable signal CALEN, the first code adjustment circuit 12 may adjust a value of the source impedance pull-up code ZQPUCD according to a result based on a comparison between a voltage of the first node ND1 and a first reference voltage VREF1. The first code adjustment circuit 12 may include a comparator 12-1 and a counter (CNTR) 12-2. The comparator 12-1 may output a first comparison signal CMP1, which is a result based on a comparison between the voltage of the first node ND1 and the first reference voltage VREF1. The comparator 12-1 may determine whether the first comparison signal CMP1 is in a bang-bang state, i.e., a state of repeating '1' and '0', as a lock completion to stop the fluctuation of the source impedance pull-up code ZQPUCD. The counter 12-2 may increase and decrease a value of the source impedance pull-up code ZQPUCD to match a level of the first comparison signal CMP1.

The second replication circuit 13 may be coupled between the power terminal and a second node ND2. The impedance of the second replication circuit 13 may be adjusted according to the source impedance pull-up code ZQPUCD. The second replication circuit 13 may be configured substantially the same as the first replication circuit 11.

The third replication circuit 14 may be coupled between the second node ND2 and a ground terminal. The third replication circuit 14 may have an impedance that is adjusted according to the source impedance pull-down code ZQPDCD. The third replication circuit 14 may be constructed by replicating a pull-down driver PDDRV of the transmitter circuit TX-CHA, which will be described with reference to FIG. 5.

During an activation period of the impedance adjustment enable signal CALEN, the second code adjustment circuit 15 may adjust a value of the source impedance pull-down code ZQPDCD according to a result based on a comparison between a voltage of the second node ND2 and a second reference voltage VREF2. The second code adjustment circuit 15 may include a comparator 15-1 and a counter (CNTR) 15-2. The comparator 15-1 may output a second comparison signal CMP2, which is a result based on a comparison between the voltage of the second node ND2 and the second reference voltage VREF2. The comparator 15-1 may determine whether the second comparison signal CMP2 is in a bang-bang state as a lock completion to stop the fluctuation of the source impedance pull-down code ZQPDCD. The counter 15-2 may increase and decrease a value of the source impedance pull-down code ZQPDCD to match a level of the second comparison signal CMP2.

Hereinafter, an operation of the calibration circuit 10 will be described as follows.

The reference resistor RZQ may be configured outside of the semiconductor apparatus so that it can maintain a constant resistance value regardless of an internal operating environment. Using a resistance value of the reference resistor RZQ as a target value, operations to adjust the impedances of the first replication circuit 11 and the second replication circuit 13 may be performed.

The first code adjustment circuit 12 may compare the voltage of the first node ND1 to the first reference voltage VREF1 during an activation period of the impedance adjustment enable signal CALEN and may complete the adjustment of the source impedance pull-up code ZQPUCD if the two values are within a tolerance level.

Then, the second code adjustment circuit 15 may compare the voltage of the second node ND2 to the second reference voltage VREF2 during an activation period of the impedance adjustment enable signal CALEN and may complete the adjustment of the source impedance pull-down code ZQPDCD if the two values are within a tolerance level.

Figure 3:
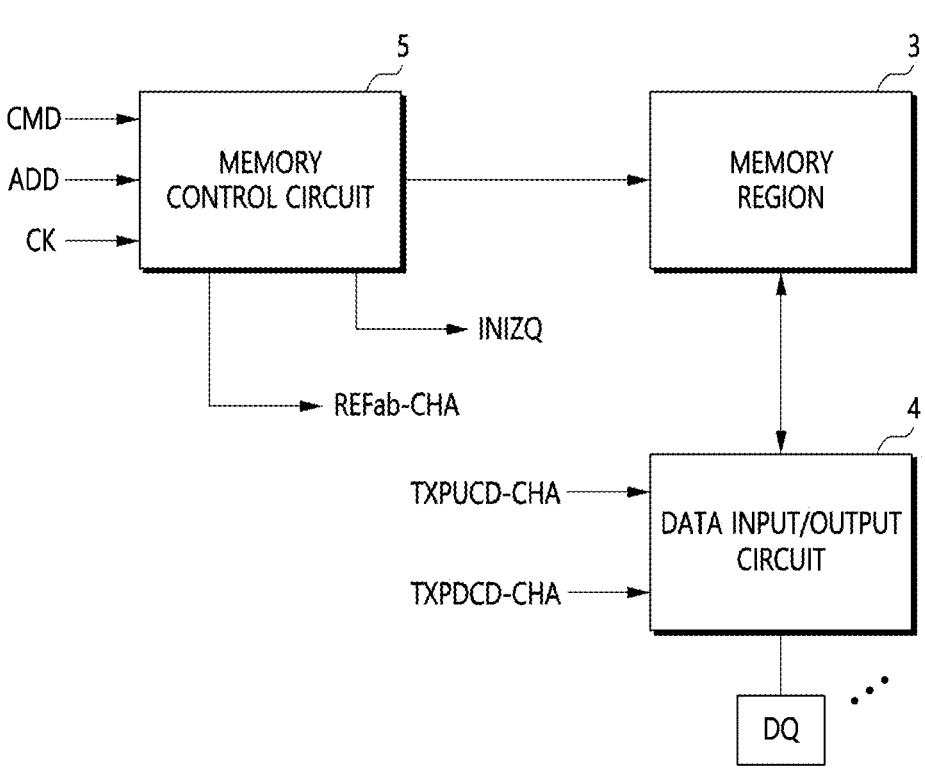
FIG. 3 is a diagram illustrating a first channel of FIG. 1.

FIG. 3 is a diagram illustrating the first channel CHA of FIG. 1.

The first channel CHA may include a memory region 3, a data input/output circuit 4, and a memory control circuit 5.

The memory region 3 may include a plurality of memory cells, and the plurality of memory cells may include at least one of a volatile memory and a non-volatile memory. The volatile memory may include SRAM (Static RAM), DRAM (Dynamic RAM), SDRAM (Synchronous DRAM), and the non-volatile memory may include ROM (Read Only Memory), PROM (Programmable ROM), EEPROM (Electrically Erase and Programmable ROM), EPROM (Electrically Programmable ROM), flash memory, PRAM (Phase change RAM), MRAM (Magnetic RAM), RRAM (Resistive RAM), and FRAM (Ferroelectric RAM), and the like. Data stored in the memory region 3 may be output during a read operation of the semiconductor apparatus 1, and data input from outside of the semiconductor apparatus 1 may be stored in the memory region 3 during a write operation. The memory cells of the memory region 3 may be divided into a plurality of unit memory regions, such as a plurality of memory banks.

The data input/output circuit 4 may be coupled to the memory region 3. The data input/output circuit 4 may exchange data with the memory region 3 or with an external source outside of the semiconductor apparatus 1. The data input/output circuit 4 may include a data input buffer, a data output buffer, a data input/output pad DQ, a pipe register, and test-related circuits, and the like.

The memory control circuit 5 may perform control operations related to a test operation, a read operation, a write operation, and address processing of the semiconductor apparatus 1. The memory control circuit 5 may be provided with a command CMD, an address ADD, a clock signal CK, and the like. In response to the command CMD, the memory control circuit 5 may generate various control signals, including the initial impedance adjustment signal INIZQ and the first channel code update request signal REFab-CHA. In response to an externally provided impedance adjustment command or an internally set timing, the memory control circuit 5 may generate the initial impedance adjustment signal INIZQ. The initial impedance adjustment signal INIZQ may define a timing interval of the impedance adjustment operation. The memory control circuit 5 may generate the first channel code update request signal REFab-CHA in response to a refresh all bank command, which is received from a source external to the first channel CHA, the refresh all bank command being a command to refresh all memory banks in the memory region 3.

The second channel CHB may be configured substantially same as the first channel CHA, so its configuration will not be described. The second channel CHB may generate the second channel code update request signal REFab-CHB in response to a refresh all bank command input to the second channel CHB from an external source.

Figure 4:
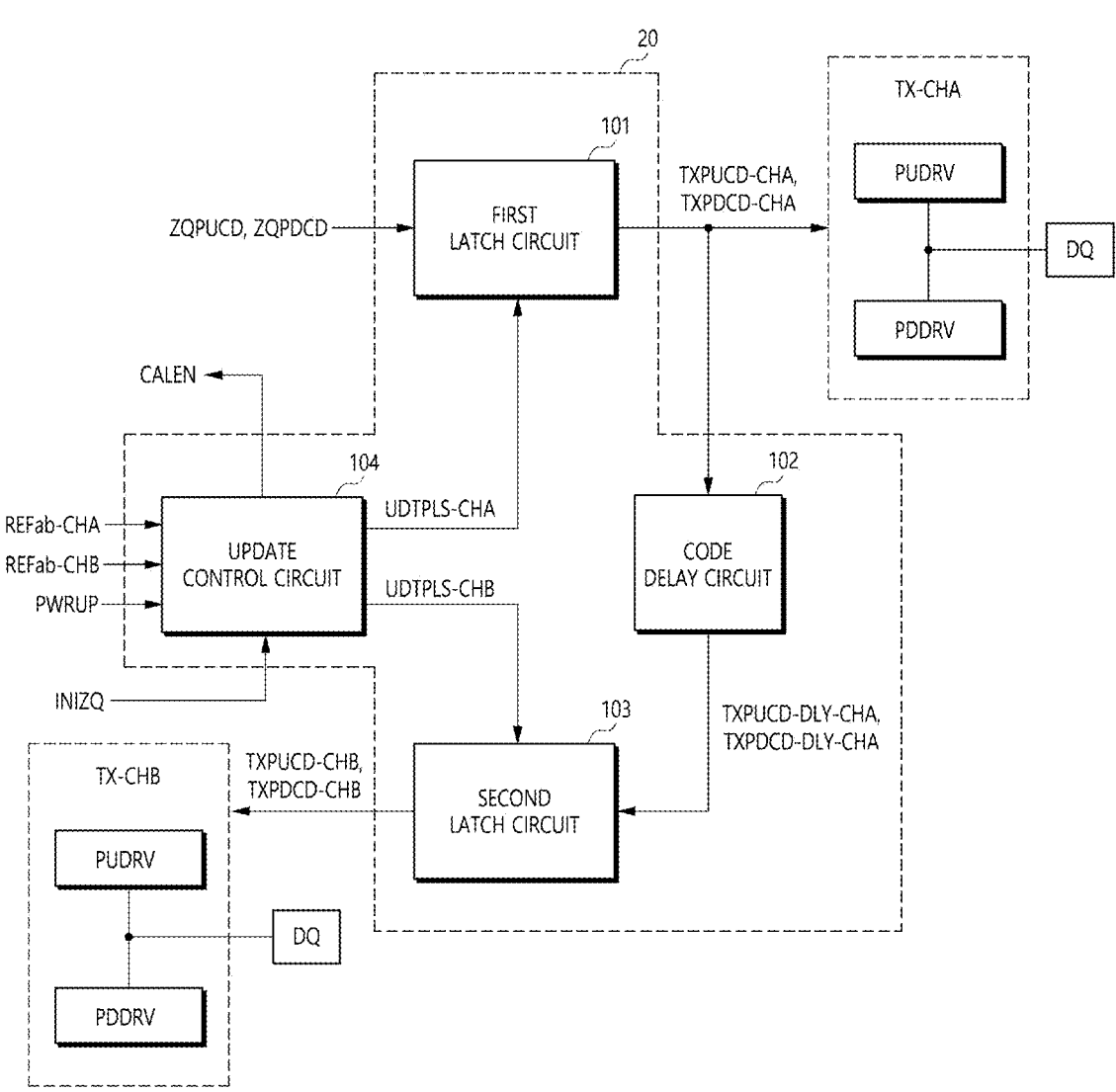
FIG. 4 is a diagram illustrating a code update circuit of FIG. 1.

FIG. 4 is a diagram illustrating the code update circuit 20 of FIG. 1.

Referring to FIG. 4, the code update control circuit 20 may include a first latch circuit 101, a code delay circuit 102, a second latch circuit 103, and an update control circuit 104.

The first latch circuit 101 may receive a first channel code update pulse UDTPLS-CHA and the source impedance code ZQPUCD, ZQPDCD as an input and may output the first channel impedance code TXPUCD-CHA, TXPDCD-CHA. The first latch circuit 101 may latch the source impedance code ZQPUCD, ZQPDCD according to the first channel code update pulse UDTPLS-CHA and may output the latched signal as the first channel impedance code TXPUCD-CHA, TXPDCD-CHA to a first transmitter circuit, that is, a transmitter circuit TX-CHA of the first channel CHA. A value of the first channel impedance code TXPUCD-CHA, TXPDCD-CHA provided to the transmitter circuit TX-CHA of the first channel CHA by the first latch circuit 101 may be updated to a value of the source impedance code ZQPUCD, ZQPDCD. The transmitter circuit TX-CHA may include a pull-up driver PUDRV and a pull-down driver PDDRV coupled to a data input/output pad DQ. The first channel impedance pull-up code TXPUCD-CHA may be input to the pull-up driver PUDRV, and the first channel impedance pull-down code TXPDCD-CHA may be input to the pull-down driver PDDRV.

The code delay circuit 102 may output a delayed first channel impedance code TXPUCD-DLY-CHA, TXPDCD-DLY-CHA by delaying the first channel impedance code TXPUCD-CHA, TXPDCD-CHA by a predetermined time.

The second latch circuit 103 may receive a second channel code update pulse UDTPLS-CHB and the delayed first channel impedance code TXPUCD-DLY-CHA, TXPDCD-DLY-CHA as inputs and may output the second channel impedance code TXPUCD-CHB, TXPDCD-CHB. The second latch circuit 103 may latch the delayed first channel impedance code TXPUCD-DLY-CHA, TXPDCD-DLY-CHA according to the second channel code update pulse UDTPLS-CHB and may output the latched signal as the second channel impedance code TXPUCD-CHB, TXPDCD-CHB to a second transmitter circuit, that is, a transmitter circuit TX-CHB of the second channel CHB. A value of the second channel impedance code TXPUCD-CHB, TXPDCD-CHB provided to the transmitter circuit TX-CHB of the second channel CHB by the second latch circuit 103 may be updated to a value of the delayed first channel impedance code TXPUCD-DLY-CHA, TXPDCD-DLY-CHA. The transmitter circuit TX-CHB may include a pull-up driver PUDRV and a pull-down driver PDDRV coupled to a data input/output pad DQ. The second channel impedance pull-up code TXPUCD-CHB may be input to the pull-up driver PUDRV, and the second channel impedance pull-down code TXPDCD-CHB may be input to the pull-down driver PDDRV.

The update control circuit 104 may receive the initial impedance adjustment signal INIZQ, the first channel code update request signal REFab-CHA, the second channel code update request signal REFab-CHB, and a power-up signal PWRUP and may output the impedance adjustment enable signal CALEN, the first channel code update pulse UDTPLS-CHA, and the second channel code update pulse UDTPLS-CHB.

The update control circuit 104 may activate the impedance adjustment enable signal CALEN for a predetermined time when the initial impedance adjustment signal INIZQ is input. The update control circuit 104 may activate the impedance adjustment enable signal CALEN for a predetermined time after a predetermined delay time when the first channel code update request signal REFab-CHA is input.

During a time period in which the delayed first channel impedance code TXPUCD-DLY-CHA, TXPDCD-DLY-CHA is being updated according to the input of the first channel code update request signal REFab-CHA, the update control circuit 104 may block a second channel code update operation by using an update blocking signal UDTPLSB-ETD even if the second channel code update request signal REFab-CHB is input.

The update control circuit 104 may perform the second channel code additional update operation according to an additional pulse of the source pulse PLSSRC generated after a deactivation of the update blocking signal UDTPLSB-ETD based on the second channel code update request signal REFab-CHB as shown in FIG. 5.

Figure 7:
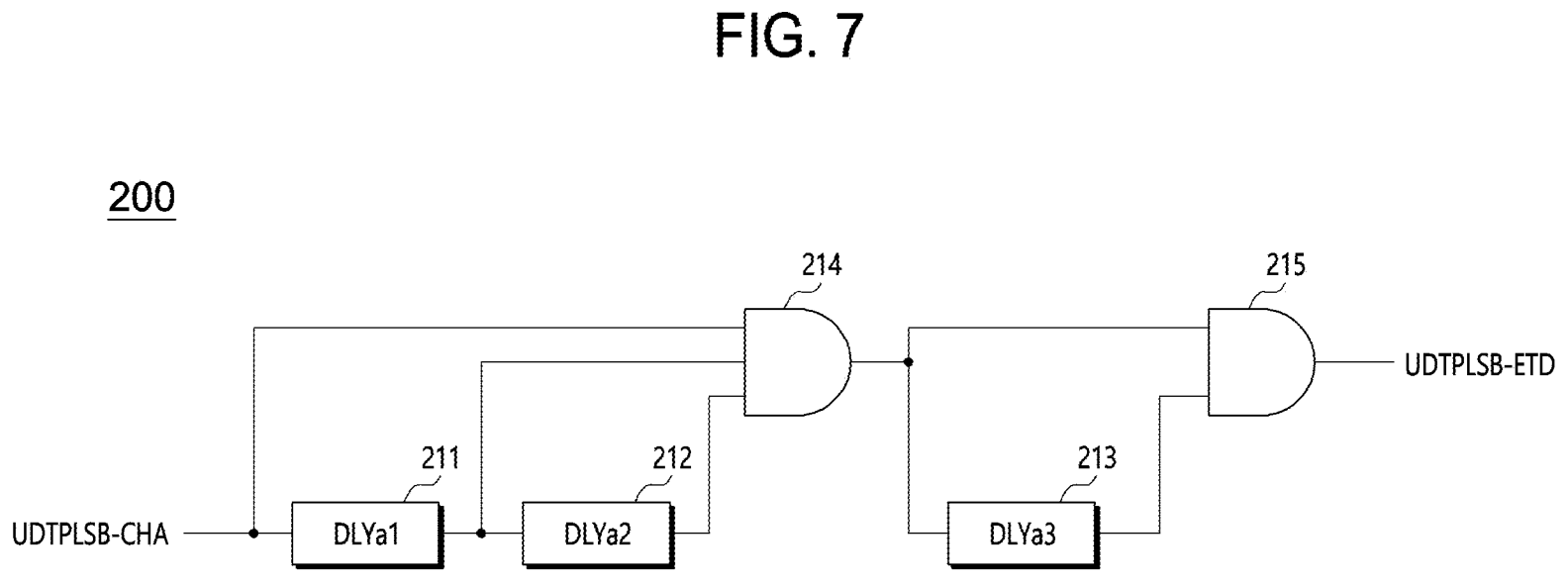
Figure 8:
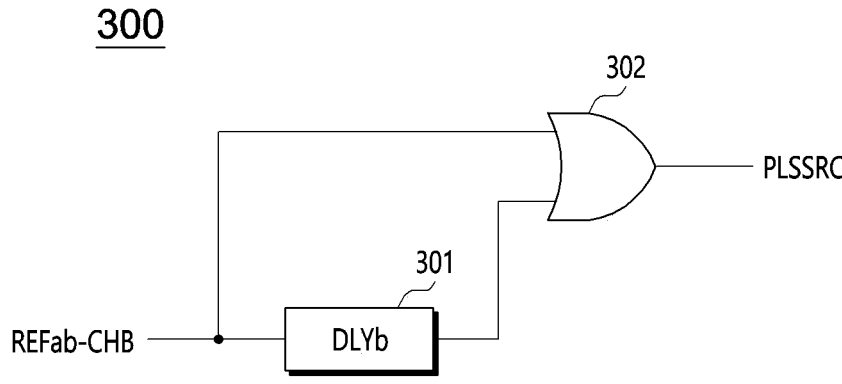
FIG. 8 is a diagram illustrating a source pulse generation circuit of FIG. 5.
Figure 9:
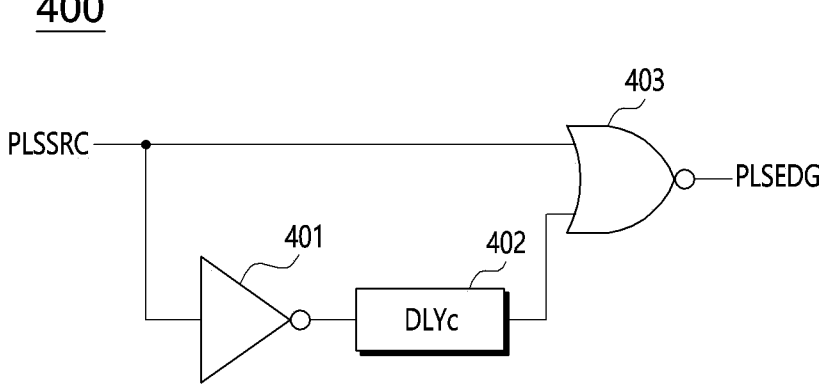
FIG. 9 is a diagram illustrating an edge detection circuit of FIG. 5.
Figure 10:
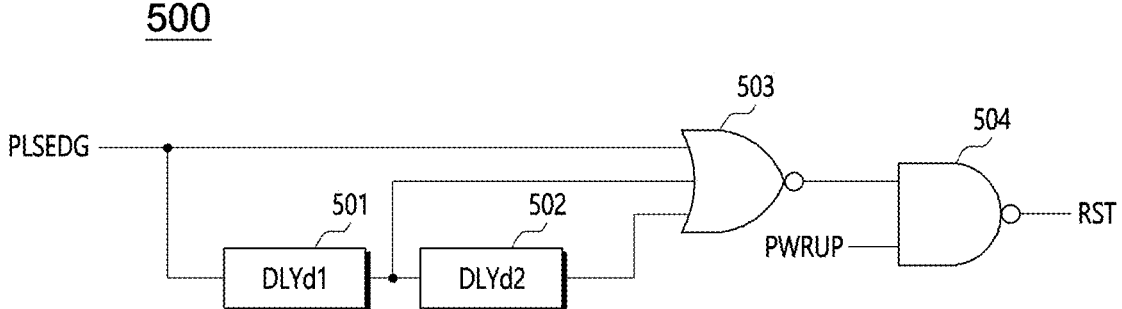
FIG. 10 is a diagram illustrating a reset circuit of FIG. 5.
Figure 11:
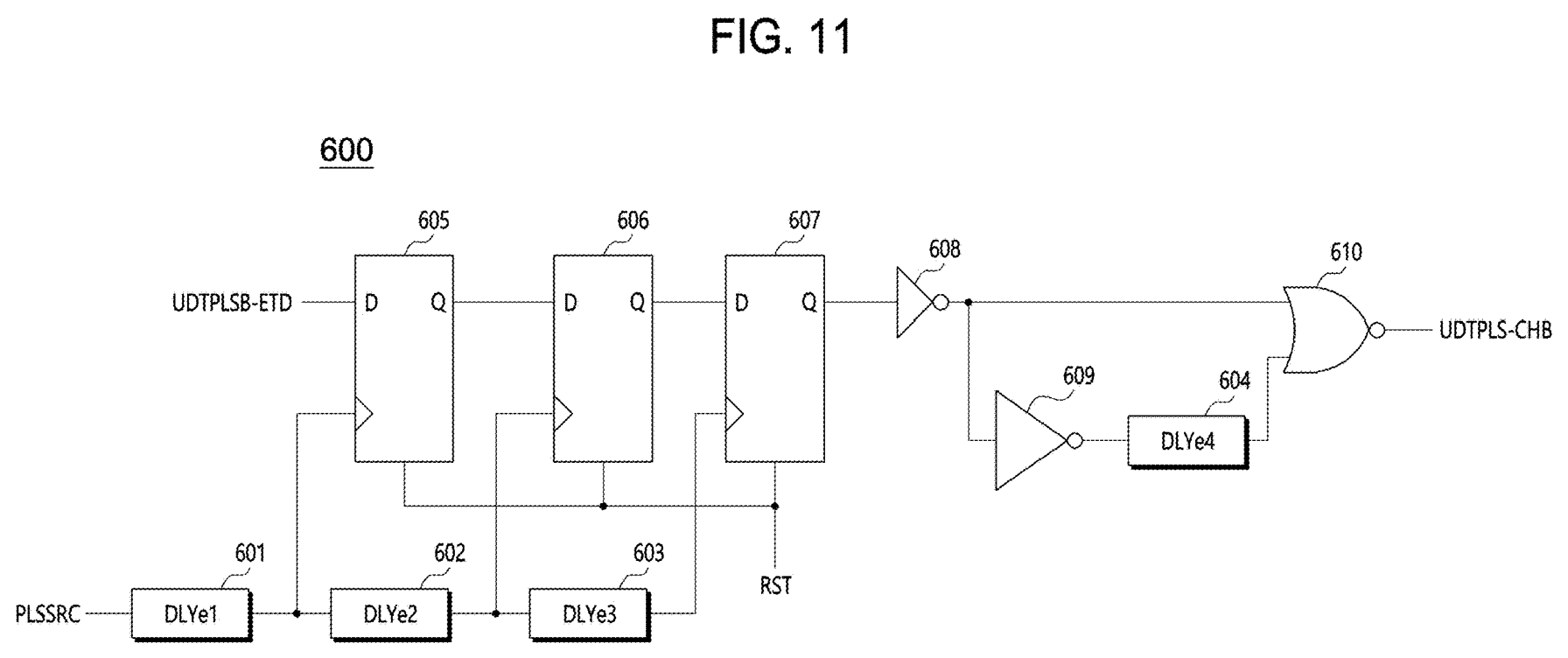
Figures 12, 13:
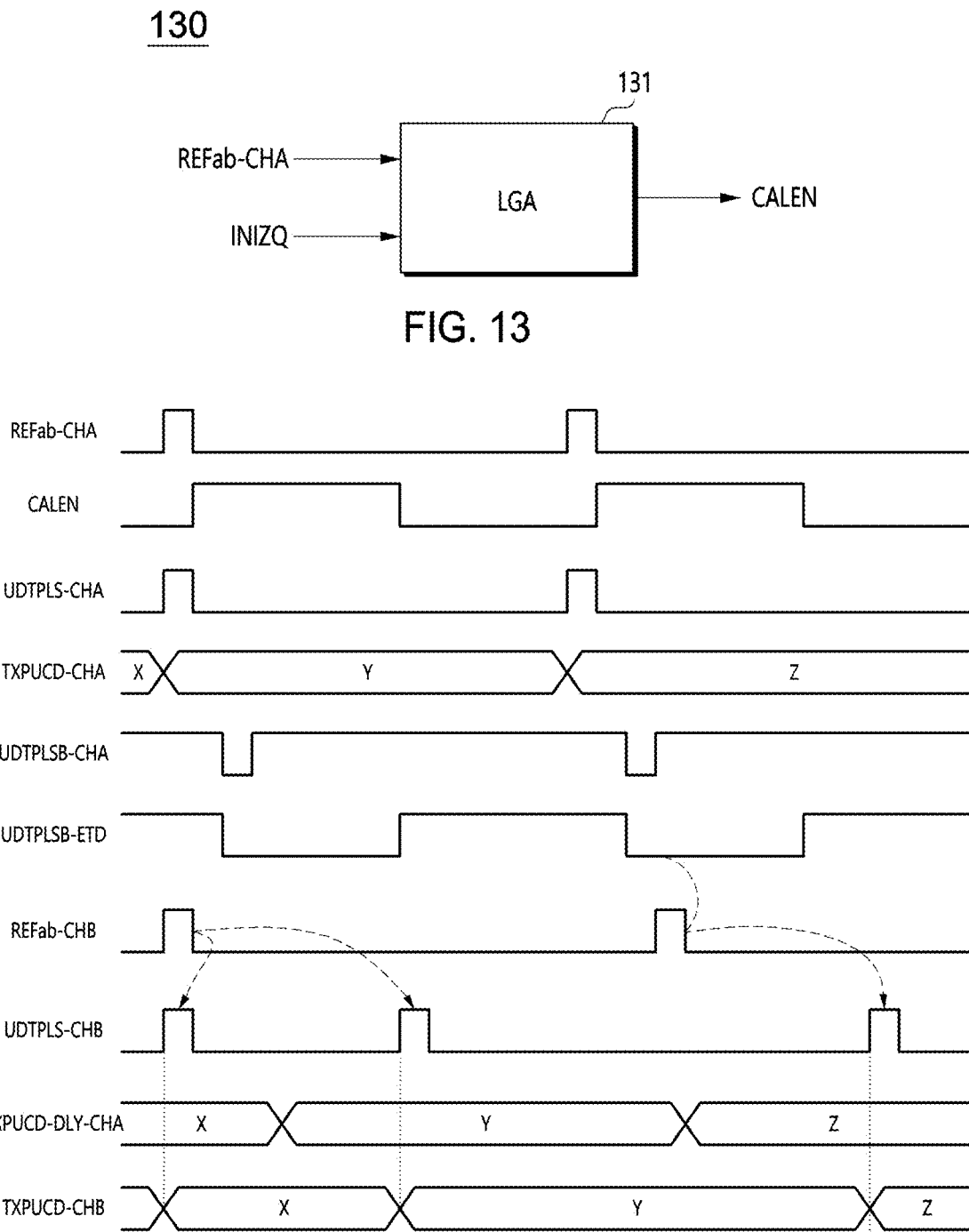
FIG. 12 is a diagram illustrating an impedance adjustment enable signal generation circuit of FIG. 5.
FIG. 13 is a diagram to illustrate code update operation according to an embodiment of the present disclosure.

FIG. 5 is a diagram illustrating the update control circuit 104 of FIG. 4, FIG. 6 is a diagram illustrating a first channel update control circuit 110 of FIG. 5, FIG. 7 is a diagram illustrating an update blocking signal generation circuit 200 of FIG. 5, FIG. 8 is a diagram illustrating a source pulse generation circuit 300 of FIG. 5, FIG. 9 is a diagram illustrating an edge detection circuit 400 of FIG. 5, FIG. 10 is a diagram illustrating a reset circuit 500 of FIG. 5, FIG. 11 is a diagram illustrating an update pulse generation circuit 600 of FIG. 5, and FIG. 12 is a diagram illustrating an impedance adjustment enable signal generation circuit 130 of FIG. 5.

Hereinafter, with reference to FIGS. 5 to 12, the configuration and operation of the update control circuit 104 will be described.

Referring to FIG. 5, the update control circuit 104 may include a first channel update control circuit 110, a second channel update control circuit 120, and an impedance adjustment enable signal generation circuit 130.

Referring to FIGS. 5 and 6, the first channel update control circuit 110 may receive the first channel code update request signal REFab-CHA as an input and may output a first channel code update pulse UDTPLS-CHA and an inverted first channel code update pulse UDTPLSB-CHA.

The first channel update control circuit 110 may include a first logic gate 111, a delay circuit DLY, and a second logic gate 113. The first logic gate 111 may buffer the first channel code update request signal REFab-CHA to be output as the first channel code update pulse UDTPLS-CHA. The delay circuit DLY may delay an output of the first logic gate 111 for a set amount of time. The second logic gate 113 may output an inverted signal of the output of the delay circuit DLY as the inverted first channel code update pulse UDTPLSB-CHA.

Referring to FIG. 5, the second channel update control circuit 120 may receive the inverted first channel code update pulse UDTPLSB-CHA, the second channel code update request signal REFab-CHB, and the power-up signal PWRUP as inputs and may output the second channel code update pulse UDTPLS-CHB. The second channel update control circuit 120 may include an update blocking signal generation circuit 200, a source pulse generation circuit 300, an edge detection circuit 400, a reset circuit 500, and an update pulse generation circuit 600.

Referring to FIGS. 5 and 7, the update blocking signal generation circuit 200 may receive the inverted first channel code update pulse UDTPLSB-CHA as an input and may output the update blocking signal UDTPLSB-ETD. The update blocking signal generation circuit 200 may expand a pulse width of the inverted first channel code update pulse UDTPLSB-CHA and may output the expanded pulse width signal as the update blocking signal UDTPLSB-ETD.

The update blocking signal generation circuit 200 may include first to third delay circuits (DLYa1, DLYa2, DLYa3) 211 to 213, a first logic gate 214, and a second logic gate 215. The first delay circuit 211 may output the inverted first channel code update pulse UDTPLSB-CHA that is delayed for a set time. The second delay circuit 212 may delay an output of the first delay circuit 211 for a set amount of time. The first logic gate 214 may output a result of performing an AND operation on the inverted first channel code update pulse UDTPLSB-CHA, an output of the first delay circuit 211, and an output of the second delay circuit 212. The third delay circuit 213 may delay an output of the first logic gate 214 for a set time and may output the result. The second logic gate 215 may output the update blocking signal UDTPLSB-ETD as a result of performing an AND operation on an output of the first logic gate 214 and an output of the third delay circuit 213.

Referring to FIGS. 5 and 8, the source pulse generation circuit 300 may receive the second channel code update request signal REFab-CHB as an input and may output the source pulse PLSSRC. The source pulse generation circuit 300 may output the second channel code update request signal REFab-CHB and a signal delayed for a set time from the second channel code update request signal REFab-CHB as the source pulse PLSSRC through one output terminal. In the source pulse PLSSRC, an earlier pulse may be referred to as a basic pulse, and a pulse delayed from the basic pulse may be referred to as an additional pulse.

The source pulse generation circuit 300 may include a delay circuit (DLYb) 301 and a logic gate 302. The delay circuit 301 may delay the second channel code update request signal REFab-CHB for a set time and then output. The logic gate 302 may output the source pulse PLSSRC as a result of performing an OR operation on the second channel code update request signal REFab-CHB and an output of the delay circuit 301. The second channel code update request signal REFab-CHB may be output as the basic pulse through the logic gate 302, and the output of the delay circuit 301 may be output as the additional pulse through the logic gate 302.

Referring to FIGS. 5 and 9, the edge detection circuit 400 may receive the source pulse PLSSRC and may output an edge detection signal PLSEDG. The edge detection circuit 400 may detect falling edges of each of the basic pulse and the additional pulse of the source pulse PLSSRC and may output the edge detection signal PLSEDG corresponding to the falling edges of each of the basic pulse and the additional pulse.

The edge detection circuit 400 may include a first logic gate 401, a delay circuit (DLYc) 402, and a second logic gate 403. The first logic gate 401 may invert the source pulse PLSSRC. The delay circuit 402 may delay an output of the first logic gate 401 for a set amount of time. The second logic gate 403 may output the edge detection signal PLSEDG as a result of performing a NOR operation on the source pulse PLSSRC and an output of the delay circuit 402.

Referring to FIGS. 5 and 10, the reset circuit 500 may receive the edge detection signal PLSEDG and the power-up signal PWRUP as inputs and may output a reset signal RST. The reset circuit 500 may include a first delay circuit 501, a second delay circuit 502, a first logic gate 503, and a second logic gate 504. The first delay circuit 501 may delay the edge detection signal PLSEDG for a set amount of time and then output. The second delay circuit 502 may delay an output of the first delay circuit 501 for a set amount of time. The first logic gate 503 may output a result of performing a NOR operation on the edge detection signal PLSEDG, an output of the first delay circuit 501, and an output of the second delay circuit 502. The second logic gate 504 may output the reset signal RST as a result of performing NOR operation on an output of the first logic gate 503 and the power-up signal PWRUP.

Referring to FIGS. 5 and 11, the update pulse generation circuit 600 may receive the update blocking signal UDTPLSB-ETD, the source pulse PLSSRC, and the reset signal RST as inputs and may output the second channel code update pulse UDTPLS-CHB. The update pulse generation circuit 600 may initialize the second channel code update pulse UDTPLS-CHB to a low level, for example, according to the reset signal RST. The update pulse generation circuit 600 may generate the second channel code update pulse UDTPLS-CHB when the source pulse PLSSRC is input during a deactivation period of the update blocking signal UDTPLSB-ETD, for example, a high-level period, and may block the generation of the second channel code update pulse UDTPLS-CHB during an activation period of the update blocking signal UDTPLSB-ETD, for example, a low-level period, regardless of the input of the source pulse PLSSRC. The update pulse generation circuit 600 may include first to fourth delay circuits (DLYe1-DLYe4) 601 to 604, first to third flip-flops 605 to 607, and first to third logic gates 608 to 610. The first delay circuit 601 may delay the source pulse PLSSRC for a set amount of time and then output. The second delay circuit 602 may delay an output of the first delay circuit 601 for a set amount of time. The third delay circuit 603 may delay an output of the second delay circuit 602 for a set amount of time. The first flip-flop 605 may latch and output the update blocking signal UDTPLSB-ETD according to the output of the first delay circuit 601. The second flip-flop 606 may latch and output an output of the first flip-flop 605 according to the output of the second delay circuit 602. The third flip-flop 607 may latch and output an output of the second flip-flop 606 according to an output of the third delay circuit 603. The outputs of the first to third flip-flops 605 to 607 may be initialized to a low level according to the reset signal RST. The first logic gate 608 may invert an output of the third flip-flop 607 to output. The second logic gate 609 may output an inverted output of the first logic gate 608. The fourth delay circuit 604 may delay an output of the second logic gate 609 for a set amount of time. The third logic gate 610 may output the second channel code update pulse UDTPLS-CHB as a result of performing a NOR operation on an output of the first logic gate 608 and an output of the fourth delay circuit 604.

Referring to FIGS. 5 and 12, the impedance adjustment enable signal generation circuit 130 may receive the first channel code update request signal REFab-CHA and the initial impedance adjustment signal INIZQ as inputs and may output the impedance adjustment enable signal CALEN. The impedance adjustment enable signal generation circuit 130 may include a logic gate array 131. The logic gate array 131 may generate the impedance adjustment enable signal CALEN having an activation period defined by the occurrence of a falling edge of the first channel code update request signal REFab-CHA. The logic gate array 131 may output the impedance adjustment enable signal CALEN that buffers the initial impedance adjustment signal INIZQ or adjusts an activation period of the initial impedance adjustment signal INIZQ.

The first channel impedance code TXPUCD-CHA, TXPDCD-CHA, described above, may be output from the first latch circuit 101 and may be provided to the second latch circuit 103 after being delayed by a signal path or the like. The first channel code update pulse UDTPLS-CHA and the second channel code update pulse UDTPLS-CHB may be independent signals that are generated without considering a delay of the first channel impedance code TXPUCD-CHA, TXPDCD-CHA. If the second channel code update pulse UDTPLS-CHB is generated while the first channel impedance code TXPUCD-CHA, TXPDCD-CHA is being updated, the second latch circuit 103 may latch a value of the first channel impedance code TXPUCD-CHA, TXPDCD-CHA in an unstable state and may update the first channel impedance code TXPUCD-CHA, TXPDCD-CHA as the second channel impedance code TXPUCD-CHB, TXPDCD-CHB.

Therefore, the present disclosure may generate the update blocking signal UDTPLSB-ETD to prevent an update by the second channel code update pulse UDTPLS-CHB in a time period in which the first channel impedance code TXPUCD-CHA, TXPDCD-CHA is being updated and may delay the first channel impedance code TXPUCD-CHA, TXPDCD-CHA for a set amount of time so that an update period of the first channel impedance code TXPUCD-CHA, TXPDCD-CHA is located within an activation period of the update blocking signal UDTPLSB-ETD. The code delay circuit 102 may delay the first channel impedance code TXPUCD-CHA, TXPDCD-CHA by the set amount of time to generate the delayed first channel impedance code TXPUCD-DLY-CHA, TXPDCD-DLY-CHA.

Furthermore, as described above, because the second channel code update pulse UDTPLS-CHB is an independent signal unrelated to the first channel CHA, the second channel impedance code TXPUCD-CHB, TXPDCD-CHB update operation may be skipped successively as it is repeatedly generated within the activation period of the update blocking signal UDTPLSB-ETD. Therefore, the second channel code update pulse UDTPLS-CHB may be further generated after the end of the activation period of the update blocking signal UDTPLSB-ETD to perform the second channel code additional update operation.

FIG. 13 is a diagram to illustrate a code update operation according to an embodiment of the present disclosure. Hereinafter, with reference to FIGS. 1 to 13, the code update operation according to an embodiment of the present disclosure will be described.

According to the initial impedance adjustment signal INIZQ generated in an initialization period of the semiconductor apparatus 1, the code update circuit 20 may activate the impedance adjustment enable signal CALEN. The calibration circuit 10 may perform an impedance adjustment operation during an activation period of the impedance adjustment enable signal CALEN to generate the source impedance code ZQPUCD, ZQPDCD.

The code update circuit 20 may generate the first channel code update pulse UDTPLS-CHA when the first channel code update request signal REFab-CHA is input and may perform a first channel code update operation to update a value of the first channel impedance code TXPUCD-CHA, TXPDCD-CHA to a value of the source impedance code ZQPUCD, ZQPDCD according to the first channel code update pulse UDTPLS-CHA. In the diagrams, only TXPUCD-CHA, one of the first channel impedance code TXPUCD-CHA, TXPDCD-CHA, TXPUCD-DLY-CHA, one of the delayed first channel impedance code TXPUCD-DLY-CHA, TXPDCD-DLY-CHA, and TXPUCD-CHB, one of the second channel impedance code TXPUCD-CHB, TXPDCD-CHB are illustrated.

Here, a value of the first channel impedance pull-up code TXPUCD-CHA before the first channel code update operation is referred to as 'X' and a value of the source impedance pull-up code ZQPUCD is referred to as 'Y'. Thus, the value 'X' of the first channel impedance pull-up code TXPUCD-CHA may be updated to 'Y', which is the value of the source impedance pull-up code ZQPUCD, based on the first channel code update operation.

The calibration circuit 10 may update a value of the source impedance pull-up code ZQPUCD to 'Z' by performing an impedance adjustment operation during an activation period of the impedance adjustment enable signal CALEN, which is activated after a deactivation of the first channel code update pulse UDTPLS-CHA.

As the first channel code update request signal REFab-CHA is input again, the first channel code update operation that updates a value of the first channel impedance code TXPUCD-CHA, TXPDCD-CHA to a value of the source impedance code ZQPUCD, ZQPDCD may be performed again. By performing the first channel code update operation performed again, the value 'Y' of the first channel impedance pull-up code TXPUCD-CHA may be updated to 'Z', which is the value of the source impedance pull-up code ZQPUCD.

Meanwhile, the code update circuit 20 may generate the update blocking signal UDTPLSB-ETD according to the inverted first channel code update pulse UDTPLSB-CHA generated according to the first channel code update pulse UDTPLS-CHA.

The code update circuit 20 may generate the second channel code update pulse UDTPLS-CHB according to each of the basic pulse and the additional pulse in the source pulse PLSSRC when the second channel code update request signal REFab-CHB is input during a deactivation period, i.e., a high-level interval, of the update blocking signal UDTPLSB-ETD prior to the first channel code update request signal REFab-CHA.

The code update circuit 20 may perform a second channel code update operation to update a value of the second channel impedance code TXPUCD-CHB, TXPDCD-CHB to a value of the delayed first channel impedance code TXPUCD-DLY-CHA, TXPDCD-DLY-CHA according to the second channel code update pulse UDTPLS-CHB.

By performing the second channel code update operation, a value of the second channel impedance pull-up code TXPUCD-CHB may be updated to 'X', which is a value of the delayed first channel impedance pull-up code TXPUCD-DLY-CHA at the corresponding time.

The code update circuit 20 may perform a second channel code additional update operation to update a value of the second channel impedance code TXPUCD-CHB, TXPDCD-CHB to a value of the delayed first channel impedance code TXPUCD-DLY-CHA, TXPDCD-DLY-CHA according to an additionally generated second channel code update pulse UDTPLS-CHB.

By performing the second channel code additional update operation, a value of the second channel impedance pull-up code TXPUCD-CHB may be updated to 'Y', which is the same value as the delayed first channel impedance pull-up code TXPUCD-DLY-CHA at the current time.

On the other hand, the code update circuit 20 might generate the second channel code update pulse UDTPLS-CHB according to the basic pulse of the source pulse PLSSRC when the second channel code update request signal REFab-CHB is input in an activation period, i.e., a low-level interval, of the update blocking signal UDTPLSB-ETD, but may only generate the second channel code update pulse UDTPLS-CHB according to the additional pulse.

By not generating the second channel code update pulse UDTPLS-CHB according to the basic pulse, a value of the delayed first channel impedance code TXPUCD-DLY-CHA, TXPDCD-DLY-CHA in an unstable state can be prevented from being updated as the second channel impedance code TXPUCD-CHB, TXPDCD-CHB.

According to the additionally generated second channel code update pulse UDTPLS-CHB, a value of the second channel impedance pull-up code TXPUCD-CHB may be updated to 'Z', which is the same value as the delayed first channel impedance pull-up code (TXPUCD-DLY-CHA) at the current time.

In addition to preventing the second channel impedance code TXPUCD-CHB, TXPDCD-CHB update operation from being skipped according to the additionally generated second channel code update pulse UDTPLS-CHB, the delayed first channel impedance code TXPUCD-DLY-CHA, TXPDCD-DLY-CHA can be updated as the second channel impedance code TXPUCD-CHB, TXPDCD-CHB after the value of the first channel impedance code TXPUCD-DLY-CHA, TXPDCD-DLY-CHA has stabilized.

A person skilled in the art to which the present disclosure pertains can understand that the present disclosure may be carried out in other specific forms without changing its technical spirit or essential features. Therefore, it should be understood that the embodiments described above are illustrative in all aspects, not limitative. The scope of the present disclosure is defined by the claims to be described below rather than the detailed description, and it should be construed that the meaning and scope of the claims and all changes or modified forms derived from the equivalent concept thereof are included in the scope of the present disclosure.

What is claimed is:

1. An impedance adjustment circuit, comprising:
a calibration circuit configured to perform an impedance adjustment operation to generate a source impedance code in response to an activation of an impedance adjustment enable signal; and
a code update circuit configured to perform a first channel code update operation to update a first channel impedance code according to the source impedance code when a first channel code update request signal is input, configured to perform a second channel code update operation to update a second channel impedance code according to the first channel impedance code when a second channel code update request signal is input, and configured to block the second channel code update operation when the second channel code update request signal is input while performing the first channel code update operation.

2. The impedance adjustment circuit of claim 1, wherein the calibration circuit comprises:
a first replication circuit configured to adjust an impedance according to a source impedance pull-up code of the source impedance code;
a first code adjustment circuit configured to, during an activation period of the impedance adjustment enable signal, adjust a value of the source impedance pull-up code according to a result based on a comparison between a first reference voltage and a voltage of a first node to which a reference resistor and the first replication circuit are coupled;
a second replication circuit configured to adjust an impedance according to the source impedance pull-up code;
a third replication circuit configured to adjust an impedance according to a source impedance pull-down code of the source impedance code; and
a second code adjustment circuit configured to, during an activation period of the impedance adjustment enable signal, adjust a value of the source impedance pull-down code according to a result based on a comparison between a second reference voltage and a voltage of a second node to which the second replication circuit and the third replication circuit are coupled.

3. The impedance adjustment circuit of claim 1, wherein, when the second channel code update request signal is input, the code update circuit is configured to perform a second channel code additional update operation by performing the second channel code update operation after the first channel code update operation is terminated.

4. The impedance adjustment circuit of claim 1, wherein, when the first channel code update request signal is input, the code update circuit is configured to activate the impedance adjustment enable signal after a predetermined delay time.

5. The impedance adjustment circuit of claim 1, wherein the code update circuit comprises:
a first latch circuit configured to latch the source impedance code in response to a first channel code update pulse and configured to output a latched source impedance code as the first channel impedance code;
a code delay circuit configured to output a delayed first channel impedance code by delaying the first channel impedance code for a set time;
a second latch circuit configured to latch the delayed first channel impedance code in response to a second channel code update pulse and configured to output a latched delayed first channel impedance code as the second channel impedance code; and
an update control circuit configured to generate the first channel code update pulse and the impedance adjustment enable signal in response to the first channel code update request signal and configured to generate the second channel code update pulse in response to the second channel code update request signal.

6. The impedance adjustment circuit of claim 5, wherein the update control circuit comprises:
a first channel update control circuit configured to receive the first channel code update request signal and output the first channel code update pulse and an inverted first channel code update pulse;
a second channel update control circuit configured to receive the inverted first channel code update pulse and the second channel code update request signal and configured to output the second channel code update pulse; and an impedance adjustment enable signal generation circuit configured to receive the first channel code update request signal and an initial impedance adjustment signal and configured to output the impedance adjustment enable signal.

7. The impedance adjustment circuit of claim 6, wherein the second channel update control circuit comprises:

an update blocking signal generation circuit configured to expand a pulse width of the inverted first channel code update pulse and output an expanded pulse width signal as an update blocking signal;

a source pulse generation circuit configured to output the second channel code update request signal and a signal delayed for a set time from the second channel code update request signal as a source pulse through one output terminal; and an update pulse generation circuit configured to generate the second channel code update pulse when the source pulse is input in a deactivation period of the update blocking signal and configured to block a generation of the second channel code update pulse independent of an input of the source pulse in an activation period of the update blocking signal.

8. The impedance adjustment circuit of claim 7, wherein the update blocking signal generation circuit comprises:

a first delay circuit configured to output the inverted first channel code update pulse that is delayed for a set time;

a second delay circuit configured to delay an output of the first delay circuit for a set time;

a first logic gate configured to output a result of a logical operation of the inverted first channel code update pulse, the output of the first delay circuit, and an output of the second delay circuit;

a third delay circuit configured to output an output of the first logic gate that is delayed for a set time; and a second logic gate configured to output a result of a logical operation of the output of the first logic gate and an output of the third delay circuit as the update blocking signal.

9. The impedance adjustment circuit of claim 7, further comprising:

an edge detection circuit configured to detect edges of each of a basic pulse and an additional pulse of the source pulse and configured to output an edge detection signal corresponding to edges of each of the basic pulse and the additional pulse; and a reset circuit configured to generate a reset signal that initializes the second channel code update pulse according to the edge detection signal and a power-up signal.

10. A semiconductor apparatus, comprising:

an impedance adjustment circuit configured to perform an impedance adjustment operation to generate a source impedance code in response to an activation of an impedance adjustment enable signal, configured to perform a first channel code update operation to update a first channel impedance code according to the source impedance code when a first channel code update request signal is input, configured to perform a second channel code update operation to update a second channel impedance code according to the first channel impedance code when a second channel code update request signal is input, and configured to block the second channel code update operation when the second channel code update request signal is input while performing the first channel code update operation;

a first channel including a first memory region and a first transmitter circuit, the first channel providing the first channel code update request signal to the impedance adjustment circuit, and configured to adjust an impedance of the first transmitter circuit according to the first channel impedance code; and a second channel including a second memory region and a second transmitter circuit, the second channel providing the second channel code update request signal to the impedance adjustment circuit, and configured to adjust an impedance of the second transmitter circuit according to the second channel impedance code.

11. The semiconductor apparatus of claim 10, wherein the impedance adjustment circuit is configured to perform a second channel code additional update operation by performing the second channel code update operation after the first channel code update operation is terminated when the second channel code update request signal is input.

12. The semiconductor apparatus of claim 10, wherein, when the first channel code update request signal is input, the impedance adjustment circuit is configured to activate the impedance adjustment enable signal after a predetermined delay time.

13. The semiconductor apparatus of claim 10, wherein the impedance adjustment circuit comprises:

a calibration circuit configured to perform the impedance adjustment operation to generate the source impedance code in response to the activation of the impedance adjustment enable signal;

a first latch circuit configured to latch the source impedance code in response to a first channel code update pulse and configured to output a latched source impedance code as the first channel impedance code;

a code delay circuit configured to output a delayed first channel impedance code by delaying the first channel impedance code for a set time;

a second latch circuit configured to latch the delayed first channel impedance code in response to a second channel code update pulse and configured to output a latched delayed first channel impedance code as the second channel impedance code; and an update control circuit configured to generate the first channel code update pulse and the impedance adjustment enable signal in response to the first channel code update request signal, and configured to generate the second channel code update pulse in response to the second channel code update request signal.

14. The semiconductor apparatus of claim 13, wherein the calibration circuit comprises:

a first replication circuit configured to adjust an impedance according to a source impedance pull-up code of the source impedance code;

a first code adjustment circuit configured to, during an activation period of the impedance adjustment enable signal, adjust a value of the source impedance pull-up code according to a result based on comparison between a first reference voltage and a voltage of a first node to which a reference resistor and the first replication circuit are coupled;

a second replication circuit configured to adjust an impedance according to the source impedance pull-up code;

a third replication circuit configured to adjust an impedance according to a source impedance pull-down code of the source impedance code; and a second code adjustment circuit configured to, during an activation period of the impedance adjustment enable signal, adjust a value of the source impedance pull-down code according to a result based on a comparison between a second reference voltage and a voltage of a second node to which the second replication circuit and the third replication circuit are coupled.

15. The semiconductor apparatus of claim 13, wherein the update control circuit comprises:

a first channel update control circuit configured to receive the first channel code update request signal and output the first channel code update pulse and an inverted first channel code update pulse;

a second channel update control circuit configured to receive the inverted first channel code update pulse and the second channel code update request signal and configured to output the second channel code update pulse; and an impedance adjustment enable signal generation circuit configured to receive the first channel code update request signal and an initial impedance adjustment signal and configured to output the impedance adjustment enable signal.

16. The semiconductor apparatus of claim 15, wherein the second channel update control circuit comprises:

an update blocking signal generation circuit configured to expand a pulse width of the inverted first channel code update pulse and output an expanded pulse width signal as an update blocking signal;

a source pulse generation circuit configured to output the second channel code update request signal and a signal delayed for a set time from the second channel code update request signal as a source pulse through one output terminal; and an update pulse generation circuit configured to generate the second channel code update pulse when the source pulse is input in a deactivation period of the update blocking signal and configured to block a generation of the second channel code update pulse independent of an input of the source pulse in an activation period of the update blocking signal.

17. The semiconductor apparatus of claim 16, wherein the update blocking signal generation circuit comprises:

a first delay circuit configured to output the inverted first channel code update pulse that is delayed for a set time;

a second delay circuit configured to delay an output of the first delay circuit for a set time;

a first logic gate configured to output a result of a logical operation of the inverted first channel code update pulse, the output of the first delay circuit and an output of the second delay circuit;

a third delay circuit configured to output an output of the first logic gate that is delayed for a set time; and a second logic gate configured to output a result of a logical operation of the output of the first logic gate and an output of the third delay circuit as the update blocking signal.

18. The semiconductor apparatus of claim 16, further comprising:

an edge detection circuit configured to detect edges of each of a basic pulse and an additional pulse of the source pulse, and configured to output an edge detection signal corresponding to edges of each of the basic pulse and the additional pulse; and a reset circuit configured to generate a reset signal that initializes the second channel code update pulse according to the edge detection signal and a power-up signal.

19. The semiconductor apparatus of claim 10, wherein the first channel and the second channel are configured to operate according to independent commands and configured to enable independent data input and output through separate data input/output pads.

* * * * *